United States Patent
Zhou et al.

(10) Patent No.: US 7,955,087 B2
(45) Date of Patent: Jun. 7, 2011

(54) MIDPLANE OF COMMUNICATION DEVICE

(75) Inventors: Wenxiang Zhou, Hangzhou (CN); Baohong Li, Hangzhou (CN)

(73) Assignee: Hangzhou H3C Technologies Co., Ltd., Hangzhou, Zhejiang Province (CN)

(*) Notice: Subject to any disclaimer, the term of this patent is extended or adjusted under 35 U.S.C. 154(b) by 4 days.

(21) Appl. No.: 12/297,045

(22) PCT Filed: Jul. 5, 2007

(86) PCT No.: PCT/CN2007/070242
§ 371 (c)(1),
(2), (4) Date: Nov. 12, 2008

(87) PCT Pub. No.: WO2008/064581
PCT Pub. Date: Jun. 5, 2008

(65) Prior Publication Data
US 2009/0263981 A1    Oct. 22, 2009

(30) Foreign Application Priority Data
Nov. 30, 2006  (CN) .......................... 2006 1 0160833

(51) Int. Cl.
*H01R 12/00* (2006.01)
*H05K 1/00* (2006.01)
(52) U.S. Cl. ......................................................... 439/62
(58) Field of Classification Search ................. 439/61, 439/62, 65
See application file for complete search history.

(56) References Cited

U.S. PATENT DOCUMENTS

| | | | |
|---|---|---|---|
| 5,887,158 A | 3/1999 | Sample et al. | |
| 6,824,391 B2* | 11/2004 | Mickievicz et al. | 439/61 |
| 2006/0024984 A1 | 2/2006 | Cohen et al. | |

FOREIGN PATENT DOCUMENTS

| | | |
|---|---|---|
| CN | 1166065 A | 11/1997 |
| CN | 2443562 Y | 8/2001 |
| CN | 1782978 A | 6/2006 |
| CN | 2854976 Y | 1/2007 |

* cited by examiner

*Primary Examiner* — Javaid Nasri
(74) *Attorney, Agent, or Firm* — Workman Nydegger

(57) ABSTRACT

A midplane of a communication device, includes the first connectors and the second connectors which connect with each other via high-speed traces, the first connectors arrange in parallel at one side of the midplane, the second connectors arrange in parallel at the other side of the midplane and in parallel with the first connectors. The wiring of high-speed traces between the first connectors and the second connectors can be disposed on the whole midplane, so that it avoids the high density of wiring in part of midplane, reduces the number of layers of the midplane and the complexity of design, and reduces the crosstalk in signals. And the cooling of the whole communication device can be accomplished by only one heat dissipation system, it reduces the complexity of design of the communication device. The area between each frames of the midplane is provided to allocate electrical power in the communication device with two or multiple frames, it reduces the costs of the communication device.

10 Claims, 4 Drawing Sheets

US 7,955,087 B2

MIDPLANE OF COMMUNICATION DEVICE

This application is based upon and claims priority to Chinese Patent Application No. 200610160833.X, filed on Nov. 30, 2006, title of which is "midplane of communication device", and the entire contents of which is expressly incorporated herein by reference.

BACKGROUND OF THE INVENTION

1. Field of the Invention

The present invention relates to a communication device in communication system and computer network, particularly, to a midplane of a communication device.

2. Description of Related Art

With development of internet, more and more types of services can be supported by internet. At present, internet supports not only services, such as Web Browser Service, etc., but also services with high bandwidth requirements, such as Video Service, Multimedia Service and so on. In order to adapt to development of broadband services, communication device, such as switch, router, etc., which has taken an important position in the broadband equipments in Intranet or Metropolitan Area Network (MAN), are facing a higher demand. With increase of network capacity, a communication device is required to support more ports and have faster port speed, so gross system capacity of the communication device also increases to a range from hundreds of Gbps (Gigabits per second) to several Tbps (Terabits per second), and even would increase to dozens of or even hundreds of Tbps in future.

The growth of the system capacity of a communication device has brought changes in a configuration of the communication device. A multi-plane exchange technology has been used commonly in current high-level communication devices, in which a plurality of exchange-cards work together to complete data exchange between line-cards. In this way, high-speed data links are required to connect each line-card to each exchange-card. The bandwidth of each line-card may reach to dozens or even hundreds of Gbps, the number of high-speed data links from the each line-card to each exchange-card correspondingly reaches to dozens or even hundreds, so the whole high-speed data links of the communication device may reach to thousands.

Since wiring of these high-speed data links is usually disposed in a backplane, very high requirement is made to a design of the backplane. Meanwhile, in order to provide more card slots, a midplane having two sides for inserting cards has become a major choice for large-capacity communication devices. In prior art, two types of midplanes are mainly adopted as follows.

An exemplary structure of a first type of a midplane is shown in FIG. 1, two sides of the midplane 100 are provided with connectors for inserting cards, and the connectors are longitudinally parallelly arranged in general. FIG. 1a is a front view of the midplane 100, two management-card connectors 130 for connecting top-management-card(s) or other management-card(s) are arranged in the middle of one side of the midplane 100, and three interface-card connector(s) 110 for connecting interface-card(s) are arranged at each side of the management-card connectors 130. FIG. 1b is a rear view of the midplane 100, three exchange-card connectors 120 for connecting exchange-card(s) are arranged in the middle of the other side of the midplane 100, and three transaction-card connectors 140 for connecting transaction-card(s) are arranged at each side of the exchange-card connectors 120. FIG. 1c is a top view of the midplane 100, the transaction-card connectors 140 and the interface-card connectors 110 are symmetrically arranged on two sides of the midplane 100, so the transaction-card(s) and the interface-card(s) are respectively inserted into the corresponding transaction-card connector(s) 140 and the corresponding interface-card connector(s) 110 in the manner of mating insertion, so as to achieve the function of line-card(s).

For such a type of the midplane, because the exchange-card(s) is in charge of data exchange between the transaction-card(s) and the interface-card(s), high-speed traces are provided between each exchange-card connector 120 and each interface-card connector 110 and between each exchange-card connector 120 and each transaction-card connector 140. The exchange-card connectors 120 is relatively integratedly distributed in the middle of the midplane 100, and thus the wiring density will be too high in a certain part of the midplane 100, thereby the number of layers and the design complexity of the midplane 100 are increased, and the design cost and the device cost are increased.

If the communication device comprises two frames or a plurality of frames, generally, the communication device still has one unified midplane. Taking a communication device with two frames for example, when the communication device with two frames adopts a structure similar to that of the first type of the midplane, each frame comprises respective interface-card connectors 110, transaction-card connectors 140 and exchange-card connectors 120, which are distributedly arranged respectively in spaces of the midplane corresponding to the each frame. Thus, high-speed traces between the exchange-card connectors 120 in an upper frame and the interface-card connectors 110 and transaction-card connectors 140 in a lower frame cross the upper frame and the lower frame and occupy most of wiring layers, so only quite a few wiring layers on the midplane can be used for allocating power supply. However, due to very large power consumption of a large-capacity communication device, technical means, such as omnibus bars, local wiring, etc., has to be used to resolve a problem of allocating power supply on the midplane, so the design cost and the device cost are further increased.

An exemplary structure of a second type of a midplane is shown in FIG. 2, two sides of the midplane 200 are provided with connectors for inserting cards, wherein the connectors at one side of the midplane 200 are longitudinally arranged and the connectors at the other side of the midplane 200 are transversely arranged. FIG. 2a is a front view of the midplane 200, multiple line-card connectors 210 are longitudinally arranged in parallel with each other at one side of the midplane 200. FIG. 2b is a rear view of the midplane 200, multiple exchange-card connectors 220 are transversely arranged in parallel with each other at the other side of the midplane 200, and multiple management-card connectors 230 are located at the same side as and under the exchange-card connectors 220, and arranged in parallel with the exchange-card connectors 220.

For such a type of the midplane, there is an intersection point between each exchange-card connector 220 and each line-card connector 210, the position of the intersection point differs from other intersection points on the midplane, whereat a high-speed trace connection between the each exchange-card connector 220 and the each line-card connector 210 is completed, so the problem of integrated wiring on the midplane is resolved. However, cards are inserted respectively at both sides of the midplane 200 along completely different directions, so directions of heat dissipation ducts of the midplane 200 are inconsistent. Thus, it is required to provide two distinct heat dissipation systems, one of which has an up-down duct design for longitudinally inserted cards at one side, and the other of which has a left-right duct design for transversely inserted cards at the other side, which makes the design cost and the device cost of the communication devices increased.

Furthermore, since it is required to ensure the connectivity between each exchange-card and each line-card, such a type of the midplane is not applicable to a communication device with two frames or multiple frames, which yields a limitation in the system capacity.

BRIEF SUMMARY OF THE INVENTION

An object of the present invention is to overcome the above deficiencies in prior art that a midplane has too high wiring density in a certain part thereof or two heat dissipation systems are required.

To achieve the object of the present invention, the present invention provides a midplane of a communication device comprising first connectors and second connectors which are connected with each other via high-speed traces; in which the first connectors are arranged in parallel at one side of the midplane, the second connectors are arranged in parallel at the other side of the midplane and in parallel with the first connectors.

Preferably, the first connectors and the second connectors are interleavedly arranged at the two sides of the midplane.

Preferably, the first connectors and the second connectors are arranged longitudinally or transversely.

Preferably, the midplane further comprises third connectors, which are arranged at the same side as and in parallel with the first connectors or the second connectors.

Preferably, the third connectors are management-card connectors.

Preferably, the first connectors are exchange-card connectors and the second connectors are line-card connectors.

The present invention provides another midplane applied to a communication device with at least two frames, the midplane comprises first connectors and second connectors which are connected with each other via high-speed traces, wherein the first connectors are arranged in parallel at one side of the midplane, each of the first connectors crosses all of the frame; the second connectors are arranged respectively in parallel in the frames at the other side of the midplane and in parallel with the first connectors.

Preferably, the first connectors and the second connectors are interleavedly arranged at the two sides of the midplane.

Preferably, the first connectors and the second connectors are arranged longitudinally.

Preferably, the midplane further comprises third connectors, which are arranged at the same side as and in parallel with the first connectors, or arranged at the same side as and in parallel with the second connectors in the frames.

Preferably, the third connectors are management-card connectors.

Preferably, the first connectors are exchange-card connectors and the second connectors are line-card connectors.

In the present invention, since the first connectors and the second connectors are arranged respectively at the two sides of the midplane, the wiring of high-speed traces between the first connectors and the second connectors may be distributed on the whole midplane, so that the high wiring density in a certain part of the midplane is avoided, the number of layer of the midplane and the design complexity of the midplane are reduced, and the crosstalk among signals are reduced. Meanwhile, because the first connectors and the second connectors are arranged in parallel in the present invention, the heat dissipation ducts have the same direction, thereby only one heat dissipation system is required to accomplish the heat dissipation of the whole communication, the design complexity of the communication device is reduced.

Furthermore, as to a communication devices with two frames or multiple frames, in the present invention, the first connectors cross all of the frames and the second connectors are arranged in the frames, so that the wiring of interlinked high-speed traces between the first connectors and the second connectors may be distributed in the each frame. Thus, an area between the frames of the midplane may be provided to allocate power supply, the cost of the communication device is decreased.

DETAILED DESCRIPTION OF THE INVENTION

Figure 1:
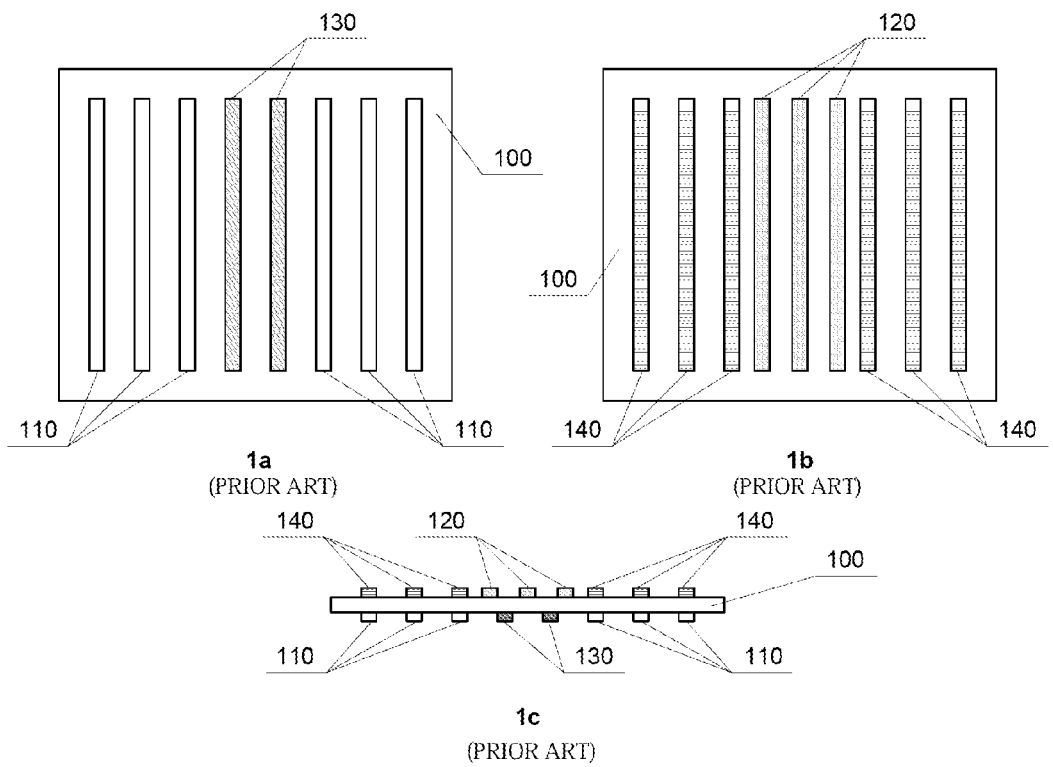
FIG. 1 illustrates an exemplary structure of a first type of a midplane in prior art.
Figure 2:
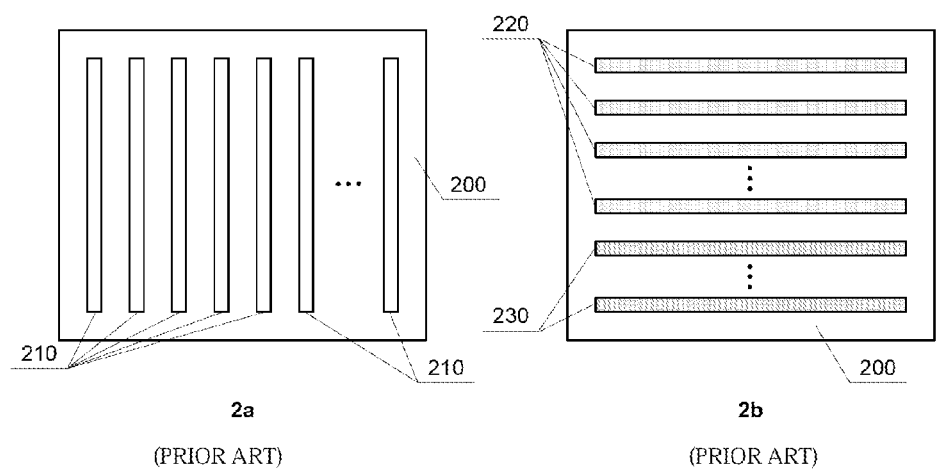
FIG. 2 illustrates an exemplary structure of a second type of a midplane in prior art.

On the midplane with a structure shown in FIG. 1, the exchange-card connectors 120 are integratedly distributed in the middle of the midplane, and the interface-card connectors 110 and the transaction-card connectors 140 are integratedly distributed at two sides of the midplane, respectively, which makes too high wiring density in a certain part of the midplane. In the present invention, the exchange-card connectors are arranged at one side of the midplane, the line-card connectors are arranged at the other side of the midplane along a direction parallel to the exchange-card connectors, so wiring of high-speed traces between the exchange-card connectors and the line-card connectors, instead of wiring of high-speed traces are dependent on the intersection points between the exchange-card connectors 220 and the line-card connectors 210 in the structure shown in FIG. 2, can substantially cover the whole midplane, and the high wiring density in a certain part of the midplane is also avoided.

Figure 3:
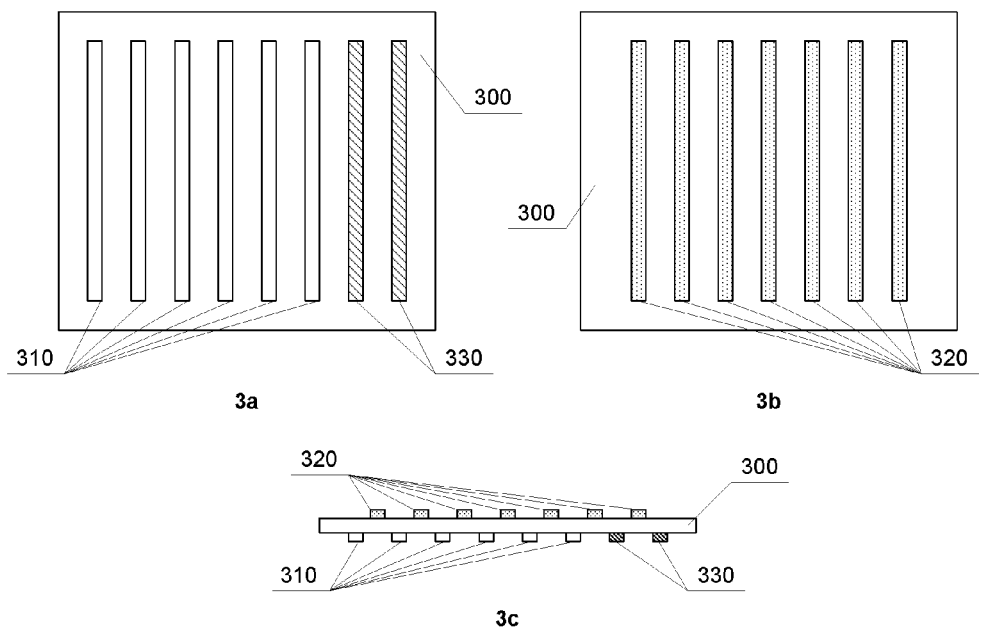
FIG. 3 illustrates an exemplary structure of a midplane in a first embodiment of the present invention.

An exemplary structure of a midplane in a first embodiment of the present invention is shown in FIG. 3. FIG. 3a is a front view of a midplane 300, six line-card connectors 310 and two management-card connectors 330 are longitudinally arranged at one side of the midplane 300, and all of the line-card connectors 310 and the management-card connectors 330 are arranged in parallel.

FIG. 3b is a rear view of the midplane 300, seven exchange-card connectors 320 are longitudinally arranged at the other side of the midplane 300 and in parallel with each other, and an arrangement direction of the exchange-card connectors 320 is parallel to that of the line-card connectors 310.

FIG. 3c is a top view of the midplane 300, the line-card connectors 310 and the management-card connectors 330 at one side of the midplane 300 and the exchange-card connectors 320 at the other side can be arranged in an interleaved distribution, that is, these connectors are not symmetrically but staggeredly arranged at two sides of the midplane 300 and in parallel with each other. Since internal signals for these connectors at the two sides of the midplane 300 are not identical, due to the interleaved arrangement of these connectors, it is more convenient to define various signals for these connectors at the two sides of the midplane 300.

Figure 4:
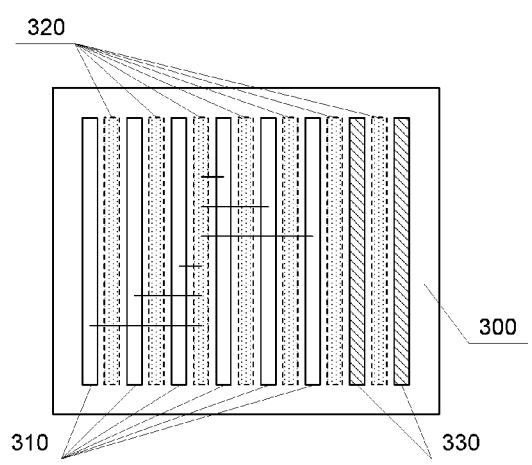
FIG. 4 is a schematic view of the wiring for high-speed traces between two types of connectors in the first embodiment of the present invention.

In this embodiment of the present invention, the wiring of high-speed traces between the line-card connectors 310 and the exchange-card connectors 320 on the midplane 300 may be disposed in a manner shown in FIG. 4. In FIG. 4, the exchange-card connectors 320 at the other side of the midplane 300 are indicated by broken lines. For the sake of clarity, only the wiring of high-speed traces between one exchange-card connector 320 and each line-card connector 310 is shown in FIG. 4. Because the wiring of high-speed traces between one exchange-card connector 320 and each line-card connector 310 can be disposed in parallel at any height position of the midplane 300, and all the line-card connectors 310 and all the exchange-card connectors 320 are arranged respectively at different sides of the midplane 300, the wiring of high-speed traces between the line-card connectors 310 and the exchange-card connectors 320 can substantially uniformly spread over the midplane 300.

Since connections between the management-card connectors 330 and the line-card connectors 310 and between the management-card connectors 330 and the exchange-card connectors 320 may be completed via either the low-speed traces or small quantities of high-speed traces, and quite a few management-card connectors 330, only 1-2 in general, are used in whole communication device and do not have heavily effect on the wiring of the midplane, the management-card connectors 330 may be arranged at an arbitrary position of the midplane, e.g. any one slot at the side of the line-card connectors 310 or any one slot at the side of the exchange-card connectors 320.

It should be appreciated that the above embodiment may be applicable to arrange more than two line-card connectors and more than two management-card connectors on the midplane, but not limited to the number of connectors shown in FIG. 3. Similarly, all of the line-card connectors, the exchange-card connectors and the management-card connectors may be transversely arranged, which can generate the same technical effect as the above-described embodiment.

Figure 5:
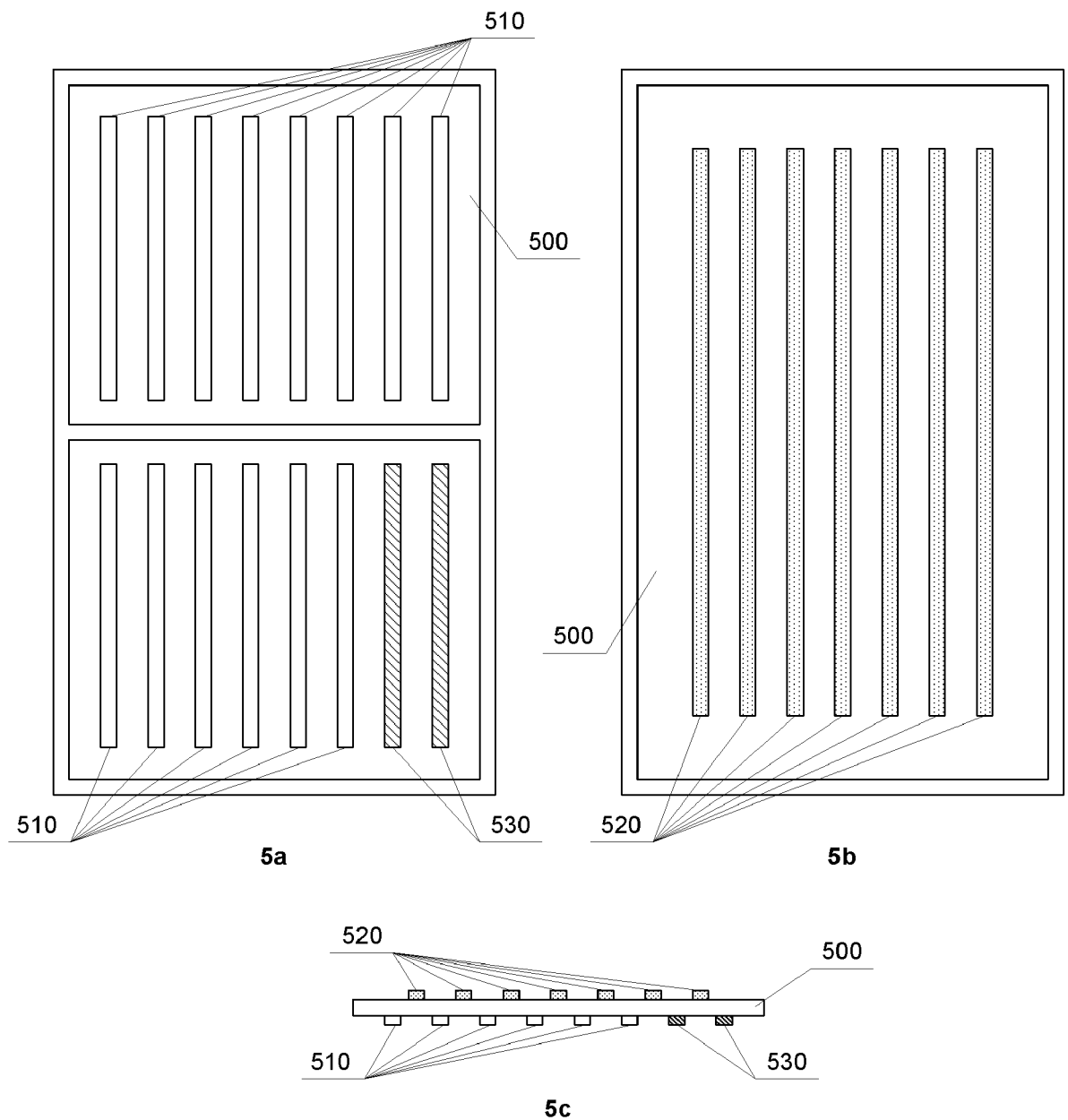
FIG. 5 is illustrates an exemplary structure of a midplane in a second embodiment of the present invention.

An exemplary structure of a midplane in the second embodiment of the present invention is shown in FIG. 5. The midplane in the second embodiment is applicable to a communication device with two frames composed of an upper frame and a lower frame. In general, a communication device with multiple frames comprises only one midplane, and the communication device in the second embodiment is provided with two frames at one side of the midplane and one frame at the other side of the midplane. Because the width of the communication device is generally limited by the width of a standard rack, the frames of the communication device with multiple frames are generally arranged longitudinally.

FIG. 5a is a front view of the midplane 500 and outer frames of the communication device, and the communication device is divided into an upper frame and a lower frame at a front side of the midplane 500. Eight line-card connectors 510, which are longitudinally arranged and in parallel with each other, are received in the space of the upper frame of the midplane 500; six line-card connectors 510, which are longitudinally arranged, and two management-card connectors 530, which are longitudinally arranged, are received in the space of the lower frame, and all of the connectors in the lower frame are arranged in parallel with each other.

FIG. 5b is a rear view of the midplane 500, one frame is formed at the rear side of the midplane 500 and receives seven exchange-card connectors 520 which are longitudinally arranged and in parallel with each other. The arrangement direction of the exchange-card connectors 520 is parallel to that of the line-card connectors 510 at the front side of the midplane 500; each exchange-card connector 520 is longitudinally extended to parts of the midplane 500 corresponding to each frame, that is, each exchange-card connector 520 crosses all of the frames, and there is a part of exchange-card connectors 520 on the side of the midplane opposite to the line-card connectors 510 in the each frame.

FIG. 5c is a top view of the midplane 500, the line-card connectors 510 and the management-card connectors 530 at one side of the midplane 500 and the exchange-card connectors 520 at the other side may be interleavedly arranged. Since internal signals of these connectors at the two sides of the midplane 500 in the embodiment are not identical, due to such an interleaved distribution of these connectors, it is more convenient to define various signals for these connectors at the two sides of the midplane 500.

Figure 6:
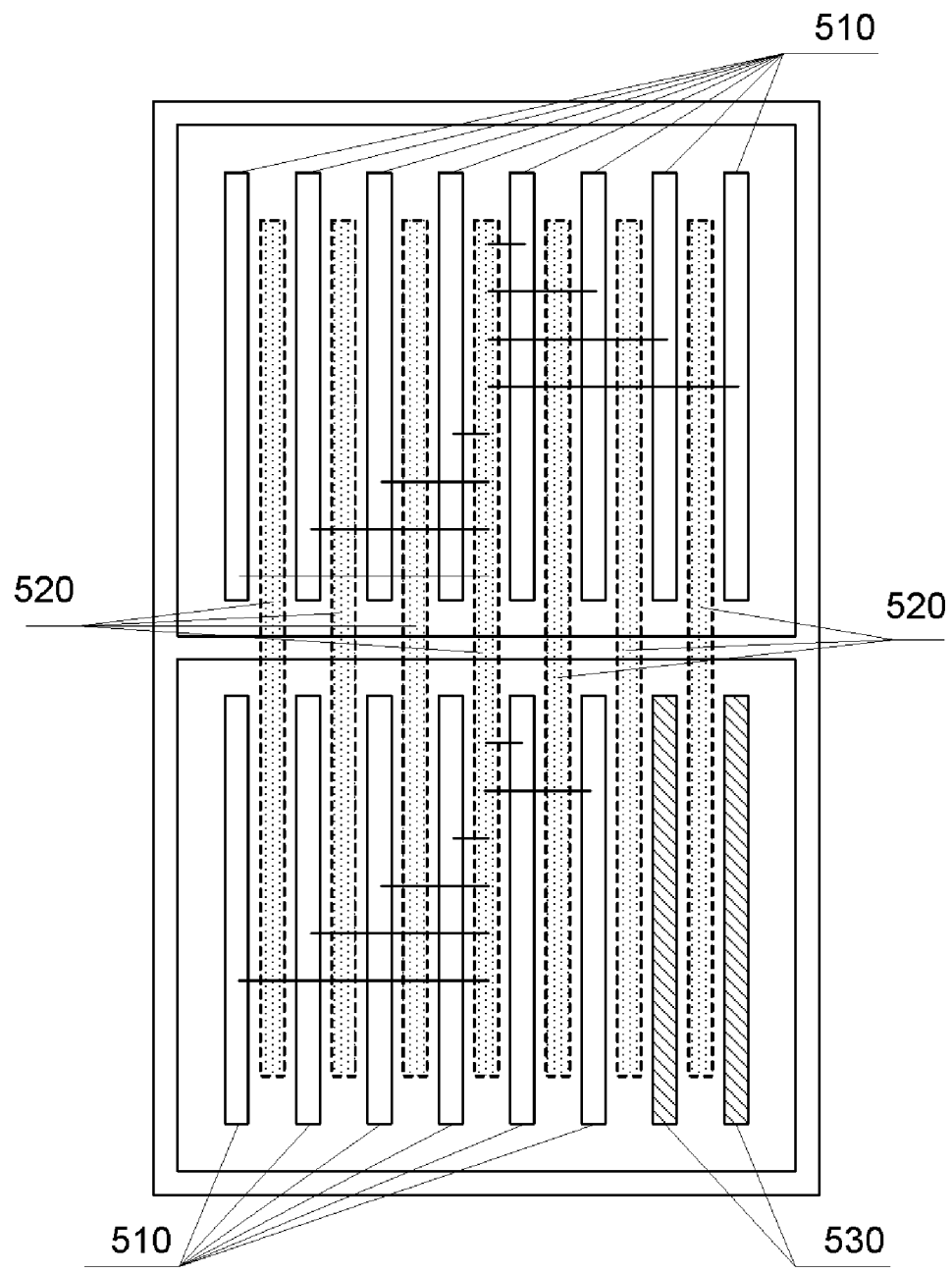
FIG. 6 is a schematic view of the wiring for high-speed traces between two types of connectors in the second embodiment of the present invention.

In this embodiment of the present invention, the wiring of high-speed traces between the line-card connectors 510 and the exchange-card connectors 520 on the midplane 500 may be disposed in a manner shown in FIG. 6. In FIG. 6, the exchange-card connectors 520 at the rear side of the midplane 500 are indicated by broken lines. For the sake of clarity, only the wiring of high-speed traces between one exchange-card connector 520 and each line-card connector 510 is shown in FIG. 6.

Because the each exchange-card connectors 520 crosses all of the frames, the wiring of high-speed traces between the each line-card connector 510 in each frame and the exchange-card connector 520 may be parallelly disposed at any height position on a part of the midplane 500 corresponding to the each frame, that is, the wiring of high-speed traces between the exchange-card connector 520 and the each line-card connectors 510 in the upper frame are parallelly transversely disposed in a part of the midplane 500 corresponding to the upper frame, and the wiring of high-speed traces between the exchange-card connector 520 and the each line-card connectors 510 in the lower frame are parallelly transversely disposed in a part of the midplane 500 corresponding to the lower frame. Thus, a part of the midplane 500, which is between two parts of the midplane 500 corresponding to the upper frame and the lower frame, is absent of wiring of high-speed traces, and thus may be used to allocate power supply or perform wiring for other signal(s).

In addition, since the exchange-card connectors 520 cross all of the frames in this embodiment, an exchange-card connected to the exchange-card connector may have a greater area. When multiple communication devices are connected with each other in a stack way to constitute a logic communication device, the exchange-card can provide a broadband connection with other communication devices, and the exchange-card having a larger area can provide an enough space for installing parallel optic module or electrical interface with respect to the broadband connection.

Since connections between the management-card connectors 530 and the line-card connectors 510 and between the management-card connectors 530 and the exchange-card connectors 520 may be completed via either low-speed traces or a certain quantities of high-speed traces, and quite a few management-card connectors 530, only 1-2 in general, are used in whole communication device and do not have heavily effect on the wiring on the midplane, the management-card connectors 530 may be arranged at an arbitrary position on the midplane, e.g., any one slot in one of the upper frame and the lower frame at the front side of the midplane 500 or any one slot at the rear side of the midplane 500.

It should be appreciated that the above embodiment may be applicable to arrange more than two line-card connectors and more than two management-card connectors on the midplane, but not limited to the number of connectors shown in FIG. 5. Similarly, all of the line-card connectors, the exchange-card connectors and the management-card connectors may be transversely arranged, which can generate the same technical effect as the above-described embodiment, however, all the frames of the communication device should be also transversely arranged at the same time.

In the present invention, a distributed configuration of the exchange-card connectors is provided for the midplane, thereby the expandability of the communication device is ensured, high wiring density in a certain part of the midplane is avoided, the number of layers of the midplane and the design complexity of the midplane are reduced, and the cost of the communication device is reduced. Moreover, the wiring density of the midplane is relatively uniform, so that crosstalk among signals is reduced, the quality of the interlinked high-speed traces signals and the stability of the communication device are improved.

Furthermore, since a configuration for inserting cards in parallel at the two sides of the midplane is provided for the communication device, the heat dissipation ducts at the two sides of the midplane are kept in the same direction, only one heat dissipation system may be used by the communication device, the design complexity of the communication device is reduced, reliability of the communication device is improved, and the cost of the communication device is reduced.

The communication device with two frames or multiple frames can be connected with the large exchange-cards which cross all of the frames, and interlinked signals of high-speed traces on the midplane do not cross between all of the frames, so that each printed circuit board layer in an area of the midplane between the frames can be provided to allocate power supply, so as to make the wiring of the midplane support power distribution with heavy current, and then the difficulty in allocating power supply for the communication device is reduced, and the cost of the communication device is reduced.

In two above-described embodiments, the exchange-card connectors and the line-card connectors need be interconnected via high-speed traces, and are arranged at two sides of the midplane; only the management-card connectors need be connected to other connectors via low-speed traces, and may be arranged at any position of the midplane. Any various types of connectors which need be connected via high-speed traces can be arranged on a midplane by the configuration of the present invention. Moreover, the midplane may further comprise connectors which are connected to other connectors via low-speed traces.

The above-mentioned embodiments provided by the present invention never limit the protected metes and bounds of the present invention. Any modification, equivalent replacement and improvement within the spirit and scope of the present invention should be embraced by the metes and bounds of the appended claims.

What is claimed is:

1. A midplane of a communication device, comprising:
   first connectors and second connectors which are connected with each other via high-speed traces and management-card connectors;
   wherein
   said first connectors are arranged in parallel with each other at one side of the midplane; and
   said second connectors are arranged in parallel with each other at the other side of the midplane and in parallel with said first connectors;
   a first interval formed between at least two of the adjacent first connectors is opposite to one second connector on the other side of the midplane; and
   a second interval formed between said second connector opposite to the first interval and another second connector adjacent to said second connector opposite to the first interval on the same side, wherein the second interval is opposite to one of the two first connectors forming the first interval.

2. The midplane of the communication device according to claim 1, wherein said first connectors and said second connectors are arranged in parallel with each other in a horizontal direction of the midplane, and said management-card connectors arranged in parallel with said first connectors on the same side of the midplane are located above or below said first connectors and not opposite to the second connectors on the other side of the midplane.

3. The midplane of the communication device according to claim 1, wherein said first connectors and second connectors are arranged in parallel with each other in a vertical direction of the midplane, and said management-card connectors arranged in parallel with said second connectors on the same side of the midplane are located at left side or right side of said second connectors and not opposite to the first connectors on the one side of the midplane.

4. The midplane of the communication device according to claim 1, wherein said first connectors and said second connectors are arranged in parallel with each other in a horizontal direction of the midplane, said management-card connectors arranged in parallel with said second connectors on the same side of the midplane are located above or below said second connectors and not opposite to the first connectors on the one side of the midplane.

5. The midplane of the communication device according to claim 1, wherein said first connectors are exchange-card connectors and said second connectors are line-card connectors.

6. The midplane of the communication device according to claim 1, wherein said first connectors and second connectors are arranged in parallel with each other in a vertical direction of the midplane, said management-card connectors arranged in parallel with said first connectors on the same side of the midplane are located at left side or right side of said first connectors and not opposite to the second connectors on the other side of the midplane.

7. A midplane of a communication device comprising:
   a single frame provided on a first side of the midplane;
   two or more frames provided on a second side of the midplane in a vertical direction of the midplane;
   first connectors arranged in parallel with each other in the vertical direction in said single frame on the first side of the midplane, each of said first connectors crosses all of the frames on the second side of the midplane;
   second connectors arranged respectively in parallel with each other in the vertical direction in the frames on the second side of the midplane, each of the second connectors in one frame on the second side is in alignment with the corresponding second connectors in the other frames on the second side in the vertical direction, and each of the second connectors in the frames on the second side is parallel to each of the first connectors in said single frame on the first side and both of them are connected with each other via high-speed traces;
   wherein a first interval is formed between at least two of the adjacent first connectors is opposite to one second connector in each frame on the second side of the midplane, second intervals are respectively formed between said second connector in each frame on the second side of the midplane opposite to the first interval and another second connector adjacent to this second connector, and wherein the second intervals are opposite to one of the two first connectors forming the first interval; and management-card connectors electrically connected to said midplane.

8. The midplane of the communication device according to claim 7, wherein said management-card connectors arranged in said single frame on the first side of the midplane are located in left side or right side of said first connectors and parallel to said first connectors in the vertical direction, and each of said management-card connectors and each of the second connectors in each frame on the second side are staggered but not opposite to each other.

9. The midplane of the communication device according to claim 7, wherein said management-card connectors are arranged in any frame on the second side of the midplane, are located in left side or right side of said second connectors in the same frame and parallel to said second connectors in the same frame in the vertical direction, each of said management-card connectors is in alignment with the corresponding second connectors in the other frames, and each of said management-card connectors and each of the first connectors on the first side are staggered but not opposite to each other.

10. The midplane of the communication device according to claim 7, wherein said first connectors are exchange-card connectors and said second connectors are line-card connectors.

\* \* \* \* \*